United States Patent
Ohuchi et al.

(10) Patent No.: US 6,208,021 B1
(45) Date of Patent: *Mar. 27, 2001

(54) SEMICONDUCTOR DEVICE, MANUFACTURING METHOD THEREOF AND AGGREGATE TYPE SEMICONDUCTOR DEVICE

(75) Inventors: Shinji Ohuchi; Yasushi Shiraishi; Hiroshi Kawano; Etsuo Yamada, all of Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/806,614

(22) Filed: Feb. 26, 1997

(30) Foreign Application Priority Data

Mar. 27, 1996 (JP) .................................................. 8-070829

(51) Int. Cl.[7] .................................................... H01L 23/48
(52) U.S. Cl. ............................ 257/690; 257/737; 257/787
(58) Field of Search ..................................... 257/668, 737, 257/738, 686, 690, 787

(56) References Cited

U.S. PATENT DOCUMENTS

| 4,849,857 | * | 7/1989 | Butt et al. ............................ 361/388 |
| 4,908,736 | | 3/1990 | Webster . |
| 5,444,301 | * | 8/1995 | Song et al. ............................ 257/737 |
| 5,583,375 | | 12/1996 | Tsubosaki et al. . |
| 5,767,571 | * | 6/1998 | Kimura et al. ........................ 257/668 |
| 5,770,888 | * | 6/1998 | Song et al. ............................ 257/686 |
| 5,801,439 | * | 9/1998 | Fujisawa et al. ...................... 257/686 |
| 5,821,615 | * | 6/1998 | Lee ........................................ 257/686 |
| 5,849,608 | * | 12/1998 | Abe ....................................... 438/123 |

FOREIGN PATENT DOCUMENTS

| 59-222947 | 12/1984 | (JP) . |
| 2-296345 | 12/1990 | (JP) . |
| 4-085837 | 3/1992 | (JP) . |
| 5-309983 | 11/1993 | (JP) . |
| 6-061404 | 3/1994 | (JP) . |
| 7-22474 | 1/1995 | (JP) . |
| 8-017864 | 1/1996 | (JP) . |
| 08213513 | 8/1996 | (JP) . |

* cited by examiner

Primary Examiner—Roy Potter
(74) Attorney, Agent, or Firm—Rabin & Champagne, P.C.

(57) ABSTRACT

A resin sealing type semiconductor device, a manufacturing method thereof and a packaging structure thereof are capable of downsizing the semiconductor device and attaining high-density packaging. For this, the resin sealing type semiconductor device with leads exposed in an outer surface, is provided with spot leads adhered to a circuit forming surface of a semiconductor element with an insulating adhesive tape interposed therebetween, each independently regularly arrayed, and exposed to outside with the semiconductor element disposed inside.

20 Claims, 6 Drawing Sheets

SEMICONDUCTOR DEVICE, MANUFACTURING METHOD THEREOF AND AGGREGATE TYPE SEMICONDUCTOR DEVICE

BACKGROUND OF THE INVENTION

The present invention relates to a resin sealing type semiconductor device, a manufacturing method thereof and a packaging structure thereof.

In recent years, with rapid advancements of IC cards and memory cards as well, a resin sealing type semiconductor device mounted in the card has been required to be made thinner. In response to this demand, a good number of methods of thinning the semiconductor device have been proposed.

One of those proposals is concerned with a structure in which the upper surface of a chip support and an undersurface of a semiconductor element are exposed as disclosed in, e.g., Japanese Patent Application No.6-273262. According to this structure, a whole thickness of a package can be set on the order of 0.5 mm.

Further, as disclosed in Japanese Patent Laid-Open Publication No.5-309983 (Japanese Patent Application No.4-119133), a technique for reducing a packaging area is attained by bending a lead in an L-shape.

In the prior art resin sealing type semiconductor device described above, however, even when the package becomes thinner, the packaging area remains unchanged. That is, the lead extends along the outside of a mold resin, and hence an area of packaging on a printed circuit board is considerably wide as compared with the semiconductor element. This configuration is insufficient for actualizing high-density packaging.

The present invention aims at downsizing the resin sealing type semiconductor device and attaining the high-density packaging as well as at obviating the problems described above.

SUMMARY OF THE INVENTION

The present invention is:

(1) An upper layer of a surface formed with a semiconductor circuit is provided with an insulating layer composed of an insulating adhesive tape. A plurality of spot leads each electrically independent and regularly disposed are provided on the upper layer of the insulating layer. Further, a mold resinous portion is provided on side surface of at least the insulating layer and the semiconductor element, thereby obtaining a resin mold package structure. Based on such a structure, it is feasible to downsize a resin sealing type semiconductor device and to attain high-density packaging thereof.

(2) Moreover, in the structure of the item (1), a metal bump is formed in a portion provided with no insulating layer, i.e., with no insulating tape, whereby an electrical connection between the semiconductor element and the spot lead is actualized. Thus, the connection to the semiconductor element involves the use of not only the metal bump but also the insulating adhesive tape, thereby relieving stress upon the metal bump due to a difference in terms of thermal expansion. Then, it is possible to prevent an occurrence of deterioration and a decline in electric characteristic due to a fracture, etc. of the metal bump.

(3). In the structure of the item (1), an outside exposed surface of the spot lead is coated with metal plating. This metal plating may be coated on a surface opposite to the outside exposed surface, viz., on the surface on the side of the semiconductor element but should not be applied onto the side surface of the spot lead. More specifically, no metal plating is applied to a contact portion, with the mold resinous portion, provided on the side surface, thereby making it feasible to prevent a crack in the resin after molding.

(4). According to the structure of the item (1), a support portion composed of the same member as the spot lead but independent of the spot lead is provided on the upper layer of the insulating layer. The support portion may be provided so as to extend through a central portion of the semiconductor device surface on which the spot leads are arranged. The support portion is provided in this manner, and the structure of the semiconductor device can be strengthened, whereby a solid and highly reliable semiconductor device can be obtained.

(5). In the structure of the item (4), the spot lead and the support portion are provided in a state where these two components are so formed as to have continuity from each other through a lead frame, and are independently separated from each other by cutting the lead frame. Thus, the spot lead and the support portion can be formed simultaneously by use of the lead frame, and therefore a semiconductor device strengthened structurewise is obtained with a less number of steps.

(6). According to the structure of the item (2), the spot lead is provided with an extension lead and is electrically connected to the semiconductor element through the metal bump at a midway portion or a front edge of this extension lead. Thus, the spot lead serving as an external terminal is provided with the extension lead extending up to a junction area on the semiconductor element as a wire extends, and the metal bump is connected to this extension lead. Hence, the external terminals (spot leads) can be formed in an array without depending much on positions of the junction areas for forming the circuit on the semiconductor element.

(7). According to a method of-manufacturing a resin sealing type semiconductor device, to begin with, (a) a support portion in a lead frame is fixedly adhered to a plurality of spot leads leastwise at one surface thereof by use of an insulating adhesive tape, and (b) the plurality of spot leads are separated from the lead frame. Thus, since the support portion and the spot leads are simultaneously formed, a manufacturing efficiency can be enhanced.

(8). According to a method of manufacturing a resin sealing type semiconductor device, (a) a support portion in a lead frame is fixedly adhered to a plurality of spot leads after metal plating at one surface thereof by use of an insulating adhesive tape, (b) the plurality of spot leads are separated from the lead frame, and (c) a semiconductor element is adhered to the other surface of the adhesive tape, and the semiconductor element is resin-sealed with a mold resin. In this way, the spot lead after the metal plating is fixedly adhered by use of the insulating adhesive tape and thereafter punched out (cut out). Therefore, the spot lead is fixed in a target position and in a predetermined size as well. Further, the metal plating is previously performed and therefore becomes unnecessary afterward even in the step of assembling the semiconductor device.

Moreover, the semiconductor element is stably supported by the adhesive tape, and further the solid resin sealing type semiconductor device can be obtained with the support portion.

(9). An insulating layer composed of an insulating adhesive tape is provided on an upper layer of a surface formed with the semiconductor circuit. Provided are a plurality of spot leads respectively electrically independent and regularly disposed on an upper layer of the insulating layer, and the structure is that front edges of the spot leads extend downward in an L-shape from outside the side portion of the semiconductor element. Also, a mold resinous portion formed on side surfaces of at least the insulating layer and the semiconductor element, thus providing a resin mold package structure. In this way, the L-shaped leads are exposed outside along the side surf aces of the semiconductor element, and it is therefore possible to enhance a junction strength of solder for connecting the external terminal to a foot pattern of the printed circuit board.

(10). According to a method of manufacturing a semiconductor device, (a) one surface of a plurality of spot leads in a lead frame are fixedly adhered by use of an insulating adhesive tape, (b) the semiconductor element is adhered to the other surface of the adhesive tape and is sealed with a resin, and (c) the plurality of spot leads are separated from the lead frame, and front edges of the spot leads are bent downward in an L-shape from outside the side portion of the semiconductor element. In this manner, the formation of the spot lead is not that mold resin sealing is performed after work-forming the lead frame but that the lead frame is work-formed after the mold resin sealing step in the assembly of the semiconductor device. It is therefore feasible to manufacture the resin sealing type semiconductor device capable of high-density packaging.

(11). According to a method of packaging a semiconductor device, (a) there are disposed, in a side-by-side relationship, a plurality of semiconductor devices including a plurality of L-shaped leads exposed to outside from upper surfaces of semiconductor elements within mold resinous portions, with their front edges extending downward from outside the side portions of the semiconductor elements, and the L-shaped leads are connected to each other. Then, (b) connecting portions of the L-shaped leads are connected to the same foot pattern provided on a wiring board. Accordingly, the two L-shaped leads can be connected together to the foot pattern on the same printed wiring board.

(12). According to a structure of an aggregate type semiconductor device, there are prepared a plurality of semiconductor devices including a plurality of L-shaped leads exposed to outside from upper surfaces of semiconductor elements within mold resinous portions, front edges of which extend downward from outside the side portions of the semiconductor elements. Then, the semiconductor devices are disposed in a face-to-face relationship so that front edges of the L-shaped leads face each other, and the front edges of the L-shaped leads are connected to each other. That is, the upper resin sealing type semiconductor device is reversely laminated on the lower resin sealing type semiconductor device packaged on the board, and the front edges of the L-shaped leads of the respective resin sealing type semiconductor devices are connected. Thus, the upper resin sealing type semiconductor device is reversely laminated on the lower resin sealing type semiconductor device packaged on the board, and the front edges of the L-shaped leads of the individual resin sealing type semiconductor devices are connected. It is therefore possible to attain high-density packaging on the board.

(13). In the aggregate type semiconductor device in the item (12), resin packages are each composed of a mold resin in the plurality of semiconductor devices, and undersurfaces of the resin packages are fixed to each other with an adhesive agent. Thus, the undersurfaces of the upper and lower resin sealing type semiconductor devices are fixed to each other by use of the adhesive agent, and consequently the solid compact aggregate semiconductor device can be obtained.

(14). According to a structure of the aggregate type semiconductor device, there are prepared a plurality of semiconductor devices including a plurality of L-shaped leads exposed to outside from upper surfaces of semiconductor elements within mold resinous portions, front edges of which extend downward from outside the side portions of the semiconductor elements. Then, the plurality of semiconductor devices are laminated so that front edges of the L-shaped leads are set mutually in the same direction. That is, the upper semiconductor device is further laminated in the same direction on the lower semiconductor device. With further laminations in the same direction, the aggregate type semiconductor device having more multi-layers is to be obtained. For example, the semiconductor devices are superposed in three layers by laminating one more resin sealing type semiconductor device, and the L-shaped leads thereof are connected, thereby making it feasible to acquire much-higher-density packaging upon the board.

(15). According to the structure of the item (14), in the plurality of laminated semiconductor devices, the front edge of the L-shaped lead of the upper semiconductor device is connected to a bent portion of the L-shaped lead of the lower semiconductor device. In this way, the upper semiconductor device is laminated in the same direction on the lower semiconductor device packaged on the board, and the front edge and the bent portion of the L-shaped leads of the respective semiconductor devices, are connected to each other. Hence, the still-higher-density packaging on the board is attainable simply by laminating the resin sealing type semiconductor devices sequentially in the same direction.

(16). According to the structure of the item (14), resin packages are each composed of a mold resin in the plurality of semiconductor devices, and an undersurface of the resin package of the upper semiconductor device is fixed to an upper surface of the resin package of the lower semiconductor device by use of an adhesive agent. Thus, the upper and lower semiconductor devices are fixed to each other by using the adhesive agent, and the solid compact semiconductor device can be thereby obtained.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Embodiments of the present invention will hereinafter be discussed in detail with reference to the accompanying drawings.

Figure 1:
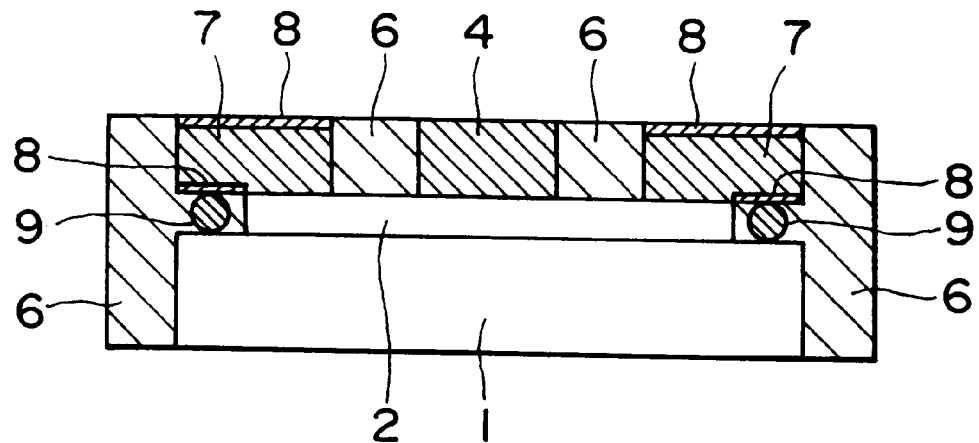
FIG. 1 is a sectional view of a resin sealing type semiconductor device, showing a first embodiment of the present invention.
Figure 2:
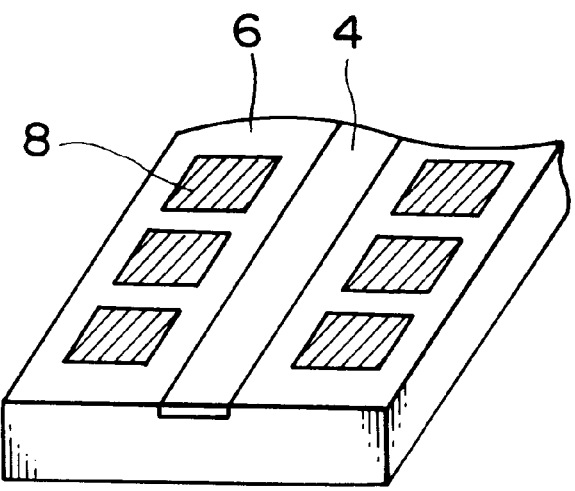
FIG. 2 is a partial perspective view of the resin sealing type semiconductor device, showing the first embodiment of the present invention.

FIG. 1 is a sectional view of a resin sealing type semiconductor device, showing a first embodiment of the present invention. FIG. 2 is a partial perspective view of the resin sealing type semiconductor device.

As illustrated in FIGS. 1 and 2, a spot lead 7 is adhered, together with a semiconductor element support 4, to one surface of an insulating adhesive tape (which is simply termed an "adhesive tape") 2. Further, a semiconductor element 1 is adhered, with its circuit forming surface set in a face-to-face relationship with the spot lead, to the other surface of the adhesive tape 2.

An electrical connection of the semiconductor element 1 to the spot lead 7 is actualized by a metal bump 9 provided in an area with no intermediary of the adhesive tape 2. This metal bump 9 is composed of a conductive metal such as a solder alloy, etc. and is provided on an unillustrated electrode surface formed on the side of the semiconductor element 1.

The spot lead 7 is coated with metal plating 8 for an external terminal (an upper surface side in the Figure) and for an internal connection (a lower surface side in the Figure). Note that the metal plating may not be coated on the side surfaces of the spot lead.

At least side external and lower portions of the spot lead 7, the support 4 and the semiconductor element 1 are sealed by mold resins 6.

Incidentally, the above-described spot leads 7 in the present embodiment are regularly arranged inwardly of the area of the semiconductor element 1, i.e., within a width of the semiconductor element 1.

Further, a height of the metal bump 9 is substantially the same as a thickness of the adhesive tape 2.

Accordingly, it follows that a thickness of the semiconductor device is a sum of the thickness of the semiconductor element 1, the height of the metal bump 9 and a thickness of the spot lead 7. Moreover, in accordance with present embodiment, the spot lead constituting the external terminal is substantially flush with the surface of the semiconductor device.

More specifically, the semiconductor device is as thin as 0.4–0.5 mm, wherein the spot lead 7 is approximately 0.125 mm thick, the metal bump 9 is 0.5 mm in height, and the semiconductor element 1 is 0.250 mm in thickness. Besides, the semiconductor element 1 is capable of accommodating the respective constructive members. Also, the connection between the spot lead 7 and the semiconductor element 1 involves the use of the metal bump 9 and the adhesive tape 2 as well, and hence a stress upon the metal bump 9 due to a difference in terms of thermal expansion therebetween is relieved, with the result that it is feasible to prevent an occurrence of deterioration and a decline in electric characteristic due to a fracture, etc. of the metal bump 9.

Furthermore, the structure depicted in FIGS. 1 and 2 is that the support 4 extends through the central portion of the semiconductor device in to-and-fro directions in FIG. 2, and therefore a solid package structure can be actualized.

Figure 3:
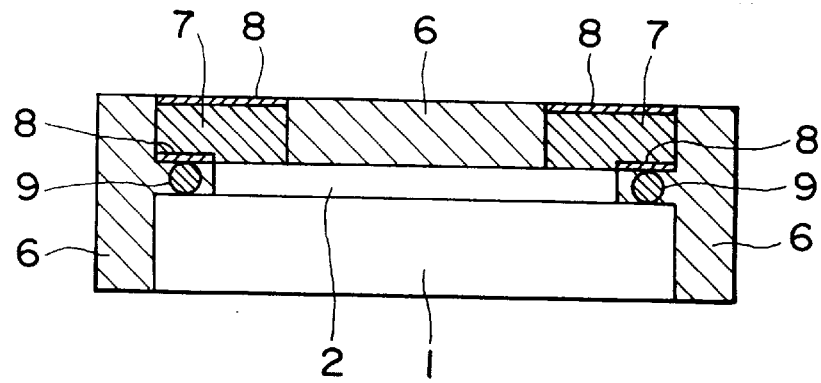
FIG. 3 is a sectional view of the resin sealing type semiconductor device, showing a modified embodiment of the first embodiment of the present invention.
Figure 4:
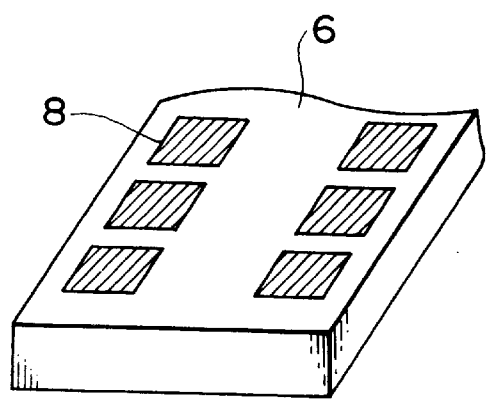
FIG. 4 is a partial perspective view of the resin sealing type semiconductor device, showing a modified embodiment of the first embodiment of the present invention.

Incidentally, the semiconductor element support is effective in increasing a rigidity of the semiconductor device but may not be necessarily indispensable. As shown in FIGS. 3 and 4, a resin sealing type semiconductor device with the support 4 removed is also, as a matter of course, available.

Figure 5:
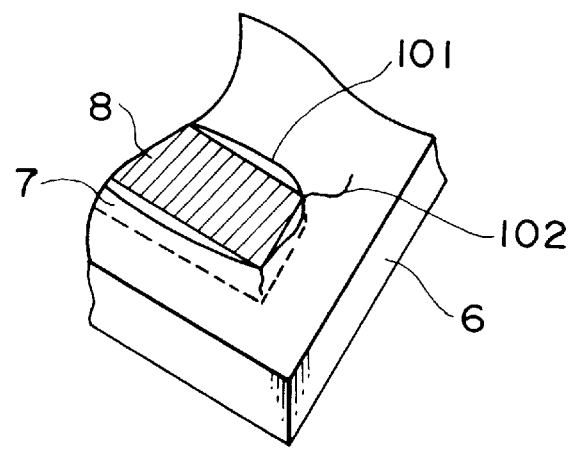
FIG. 5 is an explanatory diagram illustrating a problem inherent in the resin sealing type semiconductor device.

Further, as illustrated in FIG. 5, the spot lead 7 and the mold resin 6 are different in terms of coefficient of thermal expansion, and consequently, when reverting to the normal temperature after being sealed by the mold resin 6, a gap 101 is formed in between respective boundaries. Furthermore, it can be considered that this might be developed into a crack 102. Then, an enhancement of close-contact property at those boundaries may, as shown in FIGS. 1 and 3, entail such an arrangement that the side surfaces of the spot lead 7 are not coated with the metal plating 8 for the external terminal and for the internal connection. It is because the metal plating 8 causes a decline in the close contact with the mold resin 6. Then, the contact surface between the mold resin 6 and the metal plating 8 is eliminated.

With this configuration, since the contact between the mold resin 6 and the metal plating 8 disappears, the crack, etc. of the mold resin after molding can be prevented.

Figure 6A:
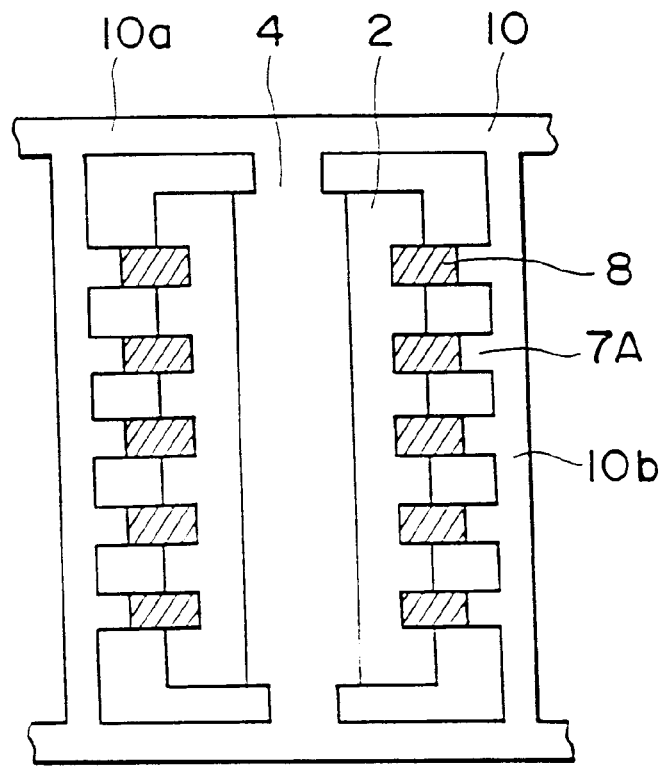
FIG. 6 is a plan view showing a step of manufacturing a lead frame in the first embodiment of the present invention.
Figure 6B:
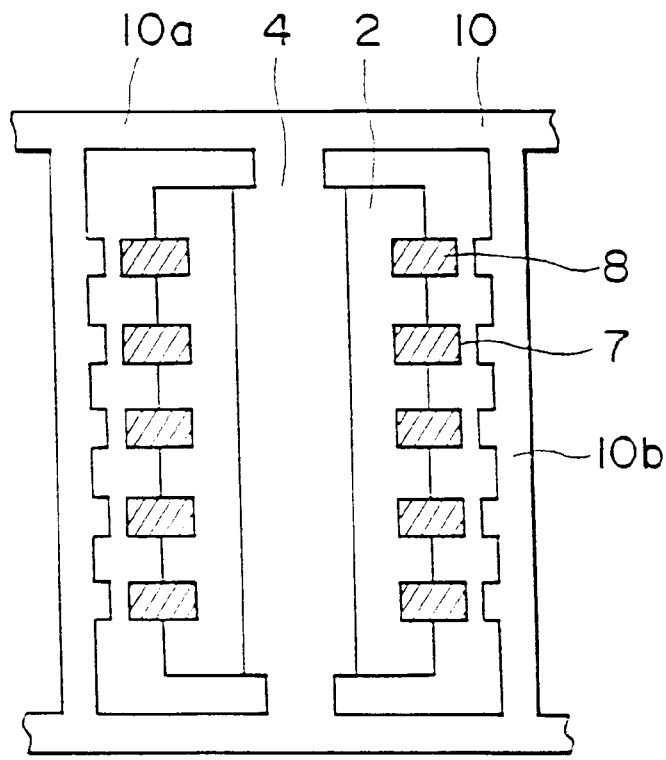

FIGS. 6(a) and 6(b) are plan views showing a step of manufacturing a lead frame in the first embodiment of the present invention. FIG. 6(a) is a plan view showing the lead frame before being cut. FIG. 6b is a plan view showing the lead frame after being cut.

To start with, as illustrated in FIG. 6(a), there is prepared a lead frame 10 including a frame member 10a, a partition member 10b, the support 4 for connecting the frame member 10a, and a plurality of leads 7A extending inward from the partition member 10b. Front edges of the plurality of leads 7A are coated with the metal plating 8 and thereafter so thermally press-fitted as to be adhered to the adhesive tape 2.

Punched out thereafter, as illustrated in FIG. 6(b), are non-contact portions between the leads 7A and the adhesive tape 2, i.e., the portions in between the partition member 10b and the front edges of the leads 7A, thus finally forming the spot leads 7. That is, there is effected the punch-out in such a size that the spot leads 7 become external terminals. The thus punched-out spot leads 7 are secured to the adhesive tape 2, and the processing directly enters an assembly of the semiconductor device.

As discussed above, in accordance with the first embodiment, after finishing the metal plating 8, the plurality of leads 7A are secured by the adhesive tape 2, and next, for punching out the above portions into the spot leads 7, the spot leads 7 are fixed in target positions and in a predetermined size. Further, the metal plating is previously carried out, and therefore the metal plating becomes unnecessary afterward even in the step of assembling the semiconductor device.

Next, a second modified embodiment of the first embodiment of the present invention will be explained.

Figure 7:
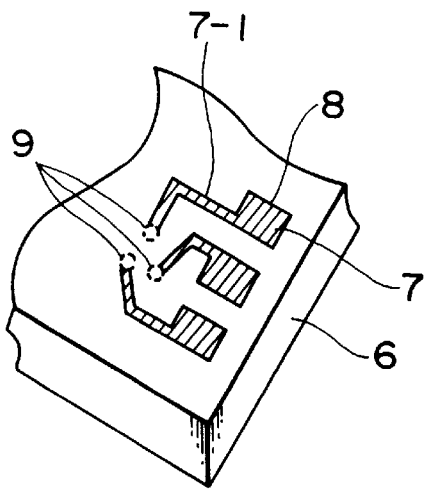
FIG. 7 is a perspective view of the principal portion of the resin sealing type semiconductor device, showing a second modified embodiment of the first embodiment of the present invention.

FIG. 7 is a perspective view of the principal portion of the resin sealing type semiconductor device, showing the second modified embodiment of the first embodiment of the present invention.

Referring to FIG. 7, there are shown the mold resin 6, the spot lead 7, an extension lead 7-1, the metal plating 8 coated on the spot lead 7 and the surface of the extension lead 7-1, and the metal bump 9.

The spot leads 7 in the first embodiment are arrayed and, corresponding thereto, soldered to foot patterns (not shown) of a printed circuit board (unillustrated). Junction areas of the semiconductor element 1 exist in the same positions as those of the spot leads 7, and this implies that the semiconductor element has no degree of freedom and might be constrained in terms of forming the circuit. Then, even if the junction areas on the semiconductor element are disposed with dispersion to some extent, the external terminals of the spot leads can be arrayed with the aid of the extension leads 7-1 in accordance with this embodiment.

That is, the spot leads 7 serving as the external terminals are provided with the extension leads 7-1 extending to the junction areas on the semiconductor element as wires extend, the metal bumps 9 are connected to the front edges of the extension leads 7-1.

Accordingly, the external terminals can be formed in an array without depending much upon the positions of the junction areas for forming the circuit on the semiconductor element.

Next, a second embodiment of the present invention will be described.

Figure 8:
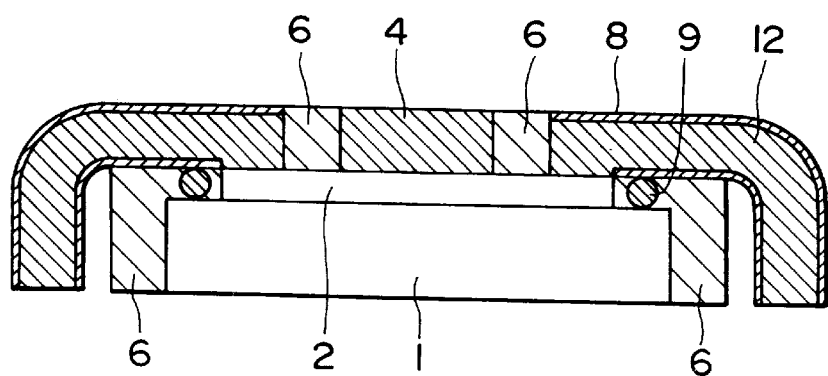
FIG. 8 is a sectional view of the resin sealing type semiconductor device, showing a second embodiment of the present invention.

FIG. 8 is a sectional view of a resin sealing type semiconductor device, showing the second embodiment of the present invention.

As illustrated in FIG. 8, though the structure is substantially the same as the first embodiment, the above-mentioned spot lead is exposed to the side surface of the semiconductor element 1, and an L-shaped lead 12 is bent in an L-shape.

Accordingly, the formation of the spot lead is, unlike the first embodiment, not that mold resin sealing is performed after work-forming the lead frame but that the lead is work-formed after the mold resin sealing step in the assembly of the semiconductor device.

Thus, the L-shaped lead 12 is exposed up to the side surface of the semiconductor element 1, and therefore a junction strength of the solder for connecting the external terminals to the foot patterns (not shown) of the printed circuit board (unillustrated), can be enhanced.

Figure 9:
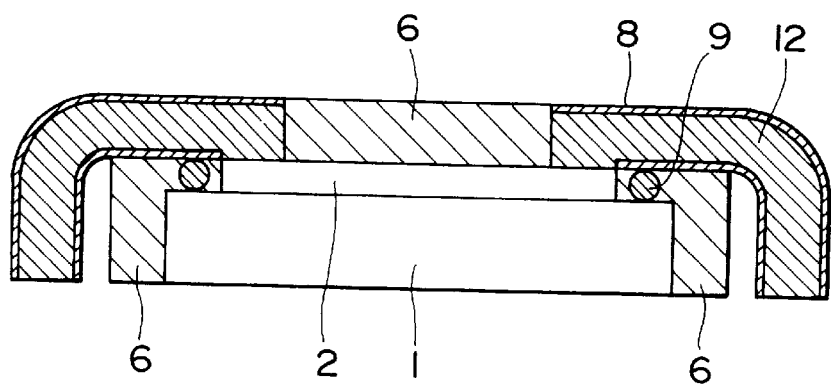
FIG. 9 is a sectional view of the resin sealing type semiconductor device, showing a modified embodiment of the second embodiment of the present invention.

Incidentally, as shown in FIG. 9, the resin sealing type semiconductor device may, as a matter of course, be constructed with an omission of the support 4 illustrated in FIG. 8.

Figure 10:
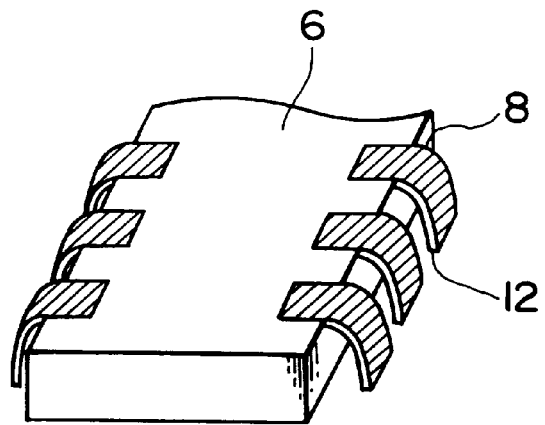
FIG. 10 is a partial perspective view of the resin sealing type semiconductor device, showing a modified embodiment of the second embodiment of the present invention.

FIG. 10 is a perspective view showing the principal portion of the resin sealing type semiconductor device constructed such that the semiconductor element support shown in FIG. 9 is eliminated, wherein the L-shaped leads coated with the metal plating 8 are arranged on both sides of the mold resin 6 by which the semiconductor element is sealed.

Figure 11:
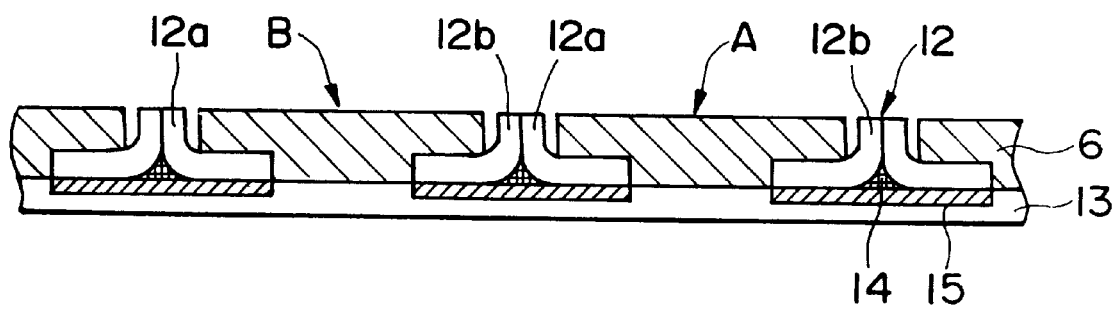
FIG. 11 is a sectional view showing a first applied embodiment of the second embodiment of the present invention.

FIG. 11 is a sectional view showing a first applied embodiment of the second embodiment of the present invention.

According to the resin sealing type semiconductor device sealed by the mold resin 6 shown in the second embodiment, because of the L-shaped leads 12 existing on the side surfaces, there can be connected L-shaped leads 12b of a resin sealing type semiconductor device B and L-shaped leads 12a of a resin sealing type semiconductor device A, which leads are adjacent to each other.

Further, the L-shaped lead 12a and the L-shaped lead 12b can be connected through a solder 14 together to a foot pattern 15 on the same printed circuit board 13. That is, the L-shaped lead 12a and the L-shaped lead 12b can be shared on the same foot pattern 15. The method of those connections is seen in many cases in the semiconductor device functioning as a memory, wherein the circuits of the semiconductor elements adjacent to each other are formed reversely, and the I/Os of the terminals are also reversed.

Thus, the L-shaped leads 12 are provided on the side surfaces of the resin sealing type semiconductor device, and it is therefore possible to compactly package the resin sealing type semiconductor devices in series on the same printed circuit board 13.

Furthermore, the wiring on the printed circuit board can be simplified.

Figure 12:
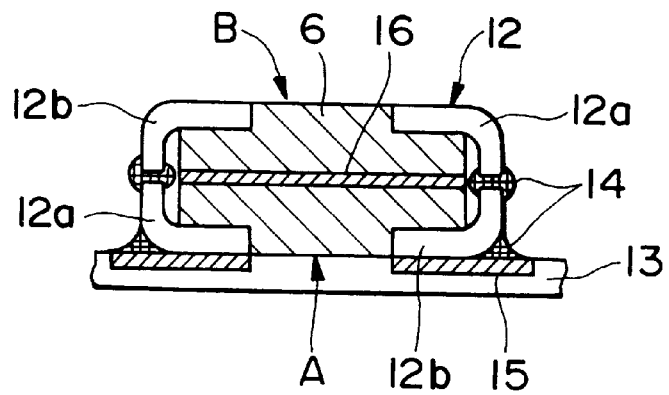
FIG. 12 is a sectional view showing a second applied embodiment of the second embodiment of the present invention.

FIG. 12 is a sectional view showing a second applied embodiment of the second embodiment of the present invention.

According to the resin sealing type semiconductor device sealed by the mold resin 6 shown in the second embodiment of the present invention, the L-shaped leads 12 extend along the side surface up to the opposite surface, and hence, as illustrated in FIG. 12, if the resin sealing type semiconductor devices are reversed (the undersurfaces thereof are directed facing toward each other) and laminated in two layers, the front edge of the L-shaped lead 12a of the resin sealing type semiconductor device A is fixed via the solder 14 to the front edge of the L-shaped lead 12b of the resin sealing type semiconductor device B. Also, the front edge of the L-shaped lead 12b of the resin sealing type semiconductor device A is connected via the solder 14 to the front edge of the L-shaped lead 12a of the resin sealing type semiconductor device B. Moreover, the undersurfaces of the semiconductor devices (resin packages) are fixed to each other with an adhesive agent 16.

Thus, the L-shaped leads extend outwardly along the side surfaces of the resin package up to the undersurface, so that the front edges of the respective L-shaped leads 12 of the resin sealing type semiconductor device A and the resin sealing type semiconductor device B reversed thereto, can be connected by the solders. Besides, the undersurfaces of the semiconductor elements are fixed to each other with the adhesive agent 16, and consequently a density of packaging on the printed circuit board 13 can be enhanced.

Note that the resin sealing type semiconductor devices used herein are reversed in terms of formation of the circuits of the respective semiconductor elements 1 and in the I/Os of the terminals as well.

Figure 13:
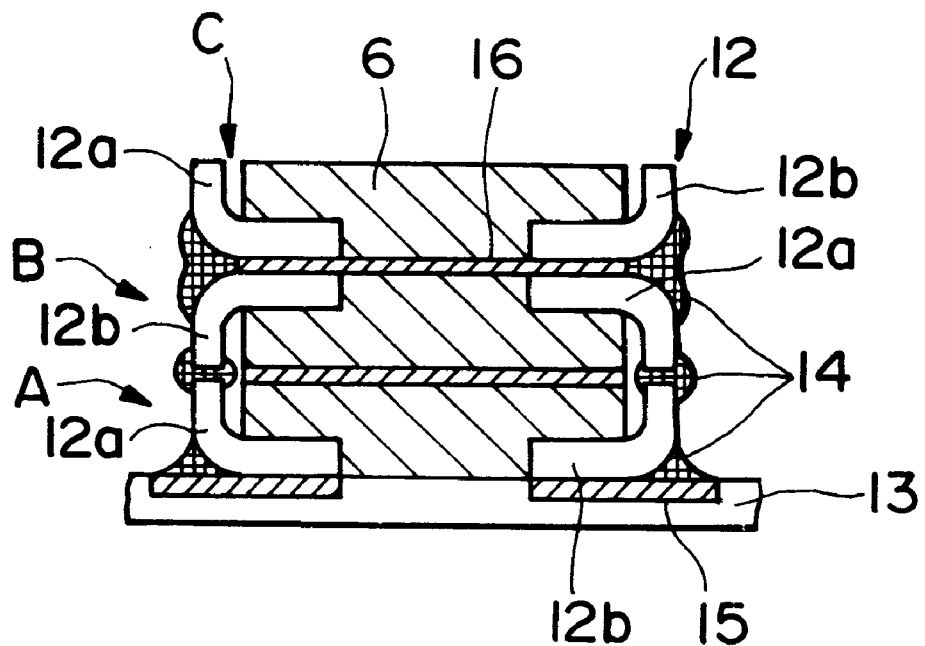
FIG. 13 is a sectional view showing a third applied embodiment of the second embodiment of the present invention.

FIG. 13 is a sectional view illustrating a third applied embodiment of the second embodiment of the present invention.

According to the third applied embodiment, as shown in FIG. 13, one more layer is laminated on the above two layers shown in FIG. 12 to form three layers. More specifically, a resin sealing type semiconductor device C serving as a third layer is laminated, in the same direction as that of the first layer, on the resin sealing type semiconductor device B as the second layer, wherein the respective L-shaped leads 12 are connected.

In this way, the resin sealing type semiconductor devices in accordance with the second embodiment of the present invention, are laminated in the three layers, and the density of packaging on the printed circuit board 13 can be therefore much more enhanced.

Further, the number of layers can be increased such as four layers, five layers and so on.

Figure 14:
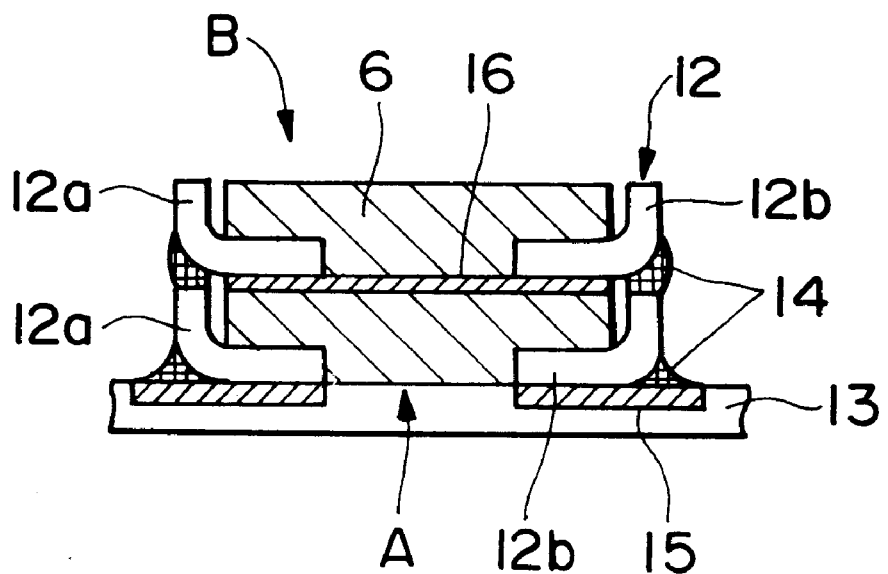
FIG. 14 is a sectional view showing a fourth applied embodiment of the present invention.

FIG. 14 is a sectional view illustrating a fourth applied embodiment of the second embodiment of the present invention.

The resin sealing type semiconductor devices sealed by the mold resins 6 shown in the second embodiment of the present invention, because of the L-shaped leads 12 extending outwardly along the side surfaces of the resin package up to the portions in the vicinity of the undersurface, can be therefore, as illustrated in FIG. 14, laminated upwards in the same direction. To be more specific, the resin sealing type semiconductor device A is packaged on the printed circuit board 13, and the resin sealing type semiconductor device B is laminated thereon in the same direction. Then, the L-shaped lead 12a of the resin sealing type semiconductor device A can be connected, via the solder 14 at the front edge and the L-bent portion of the L-shaped leads 12, to the L-shaped lead 12a of the resin sealing type semiconductor device B. The L-shaped lead 12b of the resin sealing type semiconductor device A can be connected likewise to the L-shaped lead 12b f the resin sealing type semiconductor device B. Further, the resin sealing type semiconductor devices A and B are fixed to each other with the adhesive agent 16.

Accordingly, the density of packaging on the printed circuit board 13 can be increased. The method of those connections is seen in the great majority of cases in the memory semiconductor devices that can be laminated in multi-layers with absolutely the same circuit formation elements.

Note that the present invention is not limited to the embodiment discussed above but may be modified in a variety of ways based on the gist of the present invention, and those modifications are not excluded out of the scope of the present invention.

What is claimed is:

1. A semiconductor device, comprising:
   a substrate having a semiconductor circuit surface with a semiconductor circuit formed thereon, the semiconductor circuit surface including a first surface portion composed of a central portion of the semiconductor circuit surface, and a second surface portion that surrounds the first surface portion;
   a single undivided insulating layer, including an insulating adhesive tape, on the first surface portion, the second surface portion being free of the insulating layer;
   a plurality of leads disposed both directly on the insulating layer and over the second surface portion, the leads being electrically independent of each other;
   a plurality of metal bumps, each of the leads corresponding to a respective one of the metal bumps, each of the metal bumps being disposed between the corresponding lead and the second surface portion; and
   a resin mold covering the insulating layer and the substrate, wherein surfaces of the leads are free of the mold resin and exposed for external connection.

2. The semiconductor device of claim 1, wherein the leads have metal plating at the exposed surfaces.

3. The semiconductor device of claim 1, further comprising a support member on the insulating layer, supporting the resin mold.

4. The semiconductor device of claim 3, wherein the support member subdivides the resin mold.

5. The semiconductor device of claim 3, wherein the support member and the leads are formed of the same material.

6. The semiconductor device of claim 5, wherein the support member and the leads are separated by the resin mold.

7. The semiconductor device of claim 1, wherein the leads are electrically connected to the semiconductor circuit surface through the metal bumps.

8. The semiconductor device of claim 1, further comprising extensions connected to the leads.

9. The semiconductor device of claim 8, wherein the leads are electrically connected to the semiconductor circuit surface through connections between the metal bumps and the extensions.

10. A semiconductor device of claim 1, wherein the substrate has a back surface opposite the semiconductor circuit surface and a side surface between the back surface and the semiconductor circuit surface, and wherein the resin mold is formed over only the semiconductor circuit surface and side surface so that the back surface is free of the resin mold.

11. An aggregate-type semiconductor device, comprising a plurality of individual semiconductor devices, each semiconductor device having a first surface, a second surface opposite to the first surface, and a side surface extending between the first and second surfaces, each of said individual semiconductor devices including:
   a resin mold at the first surface, and
   a plurality of leads, each lead being connected to the first surface, each lead having outer surfaces that are free of the resin mold and are exposed for external connection, each lead extending from the first surface to the side surface and extending along the side surface toward the second surface, each lead having a front edge terminating on the side surface,
   wherein each lead of each one of the individual semiconductor devices is connected to a corresponding lead of another one of the individual semiconductor devices.

12. The aggregate-type semiconductor device of claim 11, wherein each one of the leads is connected to the corresponding lead with solder.

13. The aggregate-type semiconductor device of claim 11, wherein the plurality of individual semiconductor devices are disposed in a face-to-face relationship so that the front edges of the leads of each individual semiconductor device face the corresponding leads to which they are connected.

14. The aggregate-type semiconductor device of claim 13, wherein the second surface of one of the individual semiconductor devices is connected to the second surface of another of the individual semiconductor devices with an adhesive agent.

15. The aggregate-type semiconductor device of claim 11, wherein the plurality of semiconductor devices are disposed so that the front edges of the leads are faced in the same direction.

16. The aggregate-type semiconductor device of claim 15, wherein the second surface of one of the individual semiconductor devices is connected to the first surface of another of the individual semiconductor devices with an adhesive agent.

17. A semiconductor device comprising:

a substrate having a semiconductor circuit surface with a semiconductor circuit formed thereon;

an insulating layer, including an insulating adhesive tape, on the semiconductor circuit forming surface;

a plurality of leads disposed on the insulating layer at regular intervals and being electrically independent of each other, each lead having an inner surface that faces the semiconductor circuit surface, an outer surface opposite to the inner surface, and a side surface extending between the outer and inner surfaces, wherein at least the outer surface is coated with conductive metal plating and the side surface is free of metal plating;

a plurality of metal bumps, each of the leads corresponding to a respective one of the metal bumps, each of the bumps being disposed between the inner surface of the corresponding lead and the semiconductor circuit surface; and a resin mold covering the side surfaces of the leads and surfaces of the insulating layer and the substrate, wherein the outer surfaces of the leads are free of the resin mold.

18. A semiconductor device of claim 17, wherein the inner surfaces except for the bonded portions and the outer surfaces of the leads are coated with the metal plating.

19. A semiconductor device of claim 17, wherein the substrate has a back surface opposite the semiconductor circuit surface and a side surface between the back surface and the semiconductor circuit surface, and wherein the resin mold is formed over only the semiconductor circuit surface and side surface so that the back surface is free of the resin mold.

20. The aggregate-type semiconductor device of claim 11, wherein the resin mold is formed over only the first surface and side surface so that the second surface is free of the resin mold.

* * * * *